(12) United States Patent
Kunitama et al.

(10) Patent No.: US 12,438,540 B2
(45) Date of Patent: Oct. 7, 2025

(54) SWITCHING MODULE

(71) Applicant: KYOSAN ELECTRIC MFG. CO., LTD., Yokohama (JP)

(72) Inventors: Hiroshi Kunitama, Yokohama (JP); Takuya Yoshida, Yokohama (JP)

(73) Assignee: KYOSAN ELECTRIC MFG. CO., LTD., Yokohama (JP)

(*) Notice: Subject to any disclaimer, the term of this patent is extended or adjusted under 35 U.S.C. 154(b) by 0 days.

(21) Appl. No.: 18/034,762

(22) PCT Filed: Jun. 22, 2021

(86) PCT No.: PCT/JP2021/023661
§ 371 (c)(1),
(2) Date: May 1, 2023

(87) PCT Pub. No.: WO2022/107375
PCT Pub. Date: May 27, 2022

(65) Prior Publication Data
US 2023/0421152 A1    Dec. 28, 2023

(30) Foreign Application Priority Data
Nov. 19, 2020 (JP) .................. 2020-192669

(51) Int. Cl.
H03K 17/687 (2006.01)
H03K 17/78 (2006.01)

(52) U.S. Cl.
CPC .......... *H03K 17/687* (2013.01); *H03K 17/78* (2013.01); *H03K 2217/0036* (2013.01)

(58) Field of Classification Search
CPC .................................. H03K 17/687

USPC ......................................... 327/108
See application file for complete search history.

(56) References Cited

U.S. PATENT DOCUMENTS

| | | | |
|---|---|---|---|
| 5,878,132 A | 3/1999 | Sakamoto et al. | |
| 2010/0237227 A1* | 9/2010 | Koste | H03K 17/941 250/206 |
| 2013/0009491 A1 | 1/2013 | Hafner et al. | |
| 2013/0271187 A1 | 10/2013 | Hayashi et al. | |
| 2015/0234417 A1* | 8/2015 | Kawai | G05F 5/00 323/299 |
| 2017/0288661 A1* | 10/2017 | Laschek-Enders | H10D 84/811 |
| 2018/0041127 A1 | 2/2018 | Bala et al. | |

(Continued)

FOREIGN PATENT DOCUMENTS

| | | |
|---|---|---|
| JP | S56-157143 A | 12/1981 |
| JP | H04-99810 U | 8/1992 |

(Continued)

OTHER PUBLICATIONS

Office Action dated Feb. 20, 2024, issued in counterpart JP application No. 2020-19669, with English translation. (7 pages).

(Continued)

*Primary Examiner* — Tomi Skibinski
(74) *Attorney, Agent, or Firm* — WHDA, LLP

(57) ABSTRACT

A switching module comprising: a GaN-FET mounted on a substrate; a driver circuit connected to a gate electrode of the GaN-FET via a gate resistor; and a driver power supply for supplying a drive voltage to the driver circuit. The driver circuit is configured such that a plurality of logic integrated circuits are connected in parallel.

5 Claims, 4 Drawing Sheets

(56) References Cited

U.S. PATENT DOCUMENTS

| | | |
|---|---|---|
| 2018/0131236 A1 | 5/2018 | Hosotani |
| 2020/0044647 A1 | 2/2020 | Buckley et al. |
| 2020/0211765 A1 | 7/2020 | Okazaki et al. |
| 2021/0099071 A1 | 4/2021 | Otake |

FOREIGN PATENT DOCUMENTS

| | | | |
|---|---|---|---|
| JP | H09-63850 A | | 3/1997 |
| JP | H09-107069 A | | 4/1997 |
| JP | 2006-166506 A | | 6/2006 |
| JP | 2012-165341 A | | 8/2012 |
| JP | 2012-186563 A | | 9/2012 |
| JP | 2012-195934 A | | 10/2012 |
| JP | 5866506 B2 | | 2/2016 |
| JP | 2018-37723 A | | 3/2018 |
| JP | 2018037723 A | * | 3/2018 |
| JP | 2018-64011 A | | 4/2018 |
| JP | 2019-021733 A | | 2/2019 |
| JP | 2020-036526 A | | 3/2020 |
| JP | 6772355 B1 | | 10/2020 |
| KR | 10-2020-0067325 A | | 6/2020 |
| WO | 2011095212 A2 | | 8/2011 |
| WO | 2017/010285 A1 | | 1/2017 |
| WO | 2019/163343 A1 | | 8/2019 |

OTHER PUBLICATIONS

International Search Report dated Aug. 24, 2021, issued in counterpart International Application No. PCT/JP2021/023661. (2 pages).
Office Action dated Jul. 23, 2024., issued in counterpart JP Application No. 2020-192669, with English translation. (4 pages).
Extended (Supplementary) European Search Report dated Sep. 5, 2024, issued in counterpart EP Application No. 21894252.2. (8 pages).
Office Action dated Feb. 20, 2024, issued in counterpart JP application No. 2020-192669, with English translation. (7 pages).
Office Action dated Jan. 7, 2025, issued in counterpart JP Application No. 2020-192669, with English translation. (5 pages).
Office Action dated Feb. 4, 2025, issued in counterpart JP Application No. 2024-063751, with English translation. (9 pages).
Decision of Refusal dated Jul. 1, 2025, issued in counterpart JP Application No. 2024-063751 with English translation. (7 pages).
Office Action dated Jul. 15, 2025, issued in counterpart KR Application No. 10-2023-7018431, with English translation. (9 pages).

* cited by examiner

SWITCHING MODULE

TECHNICAL FIELD

The present invention relates to a switching module applied to such as a class-D amplifier, and particularly relates to a switching module that includes a GaN-FET mounted on a substrate, a driver circuit which is connected to a gate electrode of the GaN-FET via a gate resistance, and a driver power supply for supplying a drive voltage to the driver circuit.

BACKGROUND ART

A high-frequency power supply is applied as a power source for ultrasonic oscillation, induction power generation, plasma generation or others, and has a function of converting a direct current into a high-frequency alternating current in response to a switching operation performed by a class-D amplifier. Such a class-D amplifier performing the switching operation has high power efficiency and low heating value. A module using a FET (Field Effect Transistor) is known as a module including a power semiconductor that performs the switching operation.

As a FET capable of performing the concerned switching operation, a junction type FET and a MOS type FET are well known, these FETs being capable of quick regulation of a current flowing between a source electrode and a drain electrode in response to a signal input to a gate electrode. In recent years, GaN-FET elements using gallium nitride (GaN) are being applied with the intention of further enhancing the speed of the switching operation (high-frequency switching).

As a switching module using such a GaN-FET, for example, Patent Literature 1 discloses a switching power supply for conducting envelope tracking drive on a transmission amplifier based on waveforms of an input signal, comprising a transformer to which the input signal is input on its primary side, first to third switching units that are connected on a secondary side of the transformer, a speed-up circuit including a resistor and a capacitor connected in parallel, a Schottky diode for grounding an anode, and a power FET having its gate connected to the resistor and its source connected to a cathode of the Schottky diode, wherein each of the first to third switching units includes an in-circuit FET having its gate and source connected on the secondary side of the transformer, an in-circuit Schottky diode having its cathode connected to the gate of the in-circuit FET, a Zener diode having a cathode that is series-connected to the in-circuit Schottky diode with reversed polarity and is connected to the source of the in-circuit FET, and a capacitor that is parallel-connected to the Zener diode, and wherein the source of the in-circuit FET of the first switching unit, the drain of the in-circuit FET of the second switching unit and the resistor are connected to one another, and the drain and the source of the in-circuit FET of the third switching unit are connected to the speed-up circuit in parallel, and the power FET is an normally-off N-channel GaN-FET having Schottky junction gate. Such a switching power supply may provide a high-speed and large-amplitude switching power supply for a high-efficiency radio-frequency transmitter and a method for switching the transmitter.

CITATION LIST

Patent Literature

[Patent Literature 1] Japanese Patent Laid-Open Publication No. 2012-186563

SUMMARY OF THE INVENTION

Problems to be Solved by the Invention

GaN material used in a GaN-FET has a wider band gap and a lower on-resistance than silicon used in a typical MOS-FET, and has an advantage as a switching element in that it can operate at high speeds and high temperature. For example, a GaN-FET can operate at a speed four times faster than that of a general MOS-FET when a voltage change (dV/dt), and ten times faster than that of the general MOS-FET when a current change (dI/dt).

When speeding up a switching operation, a gate current input to a gate electrode rises or falls steeply. The gate current with this steep change is susceptible to parasitic components of a FET, causing an occurrence of surge, ringing or the like.

Thus, in a case of applying a GaN-FET as a switching module, it is necessary to design a special gate drive circuit intended for inputting a gate current at an appropriate timing so as to prevent the occurrence of surge or ringing caused by the speeding-up. For example, Patent Literature 1 also provides a specific circuit that includes the transformer, the Schottky diode, the Zener diode and the capacitor interposed between a wide-band driver for generating a gate current and a switching element.

However, in a case of using a diode for rectifying a signal sent from a driver, it is necessary to lower an operating environmental temperature because a leak current is produced due to the high temperature of the Schottky diode, for instance. On the other hand, the Zener diode has a reverse characteristic, and it is necessary to connect it with the capacitor in parallel so as to increase a response speed. Thus, there is a problem that a gate drive circuit for driving a GaN-FET has a complicated configuration.

The present invention is for solving the above-described conventional problem, and aims to provide a switching module that can implement a high-speed switching with a GaN-FET even in a simple and low-cost configuration.

Means for Solving the Problem

In order to solve the above problem, a representative aspect of the present invention provides a switching module that includes a GaN-FET mounted on a substrate, a driver circuit connected to a gate electrode of the GaN-FET via a gate resistance, and a driver power supply that supplies a drive voltage to the driver circuit, wherein the driver circuit has a configuration in which a plurality of logic integrated circuits (IC) are connected in parallel.

In accordance with the invention having the above-described configuration, the driver circuit for inputting a gate current to the gate electrode of the GaN-FET has the configuration in which the plurality of logic integrated circuits (IC) are connected in parallel, so that high-speed switching can be implemented by the GaN-FET even in a simple and low-cost configuration.

BEST MODE FOR CARRYING OUT THE INVENTION

A description will now be made about representative illustrative embodiments of a switching module according to the present invention by referring to FIGS. 1 to 5.

Embodiment 1

Figure 1:
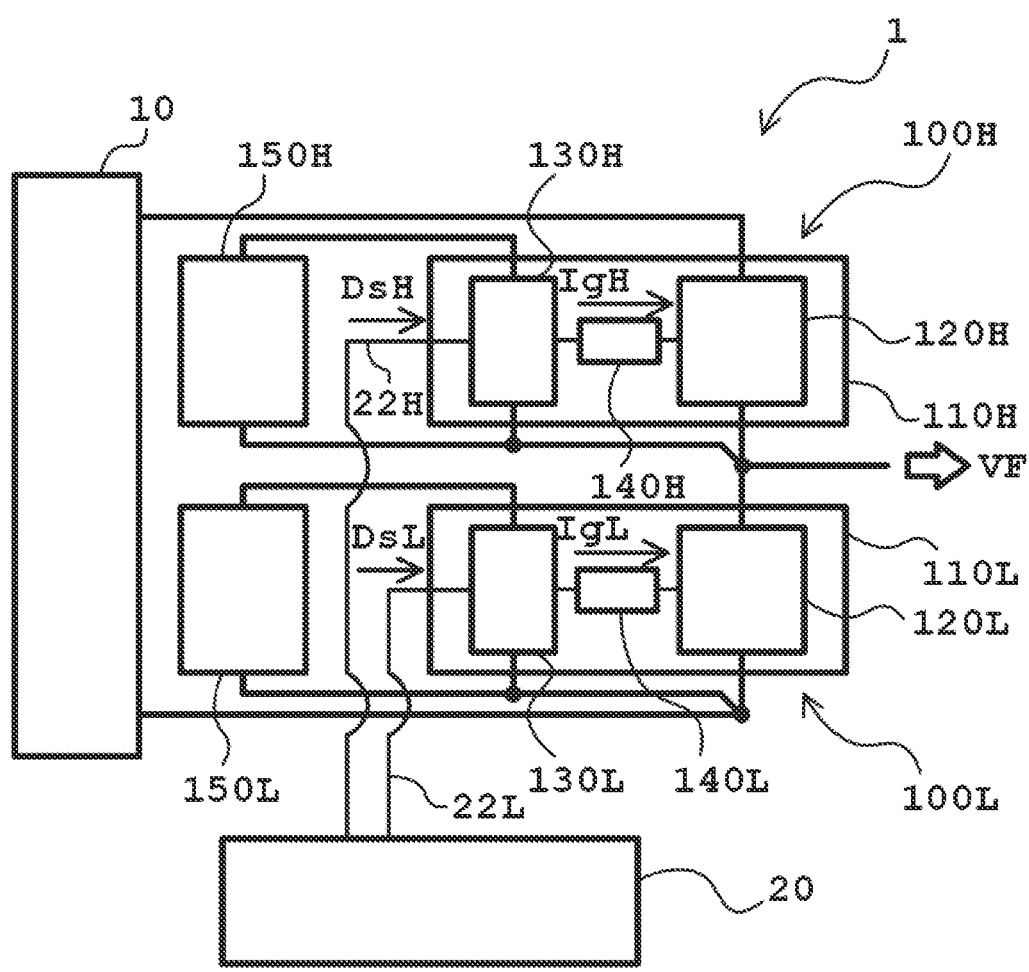
FIG. 1 is a block diagram of a high-frequency power supply device in which a switching module according to Embodiment 1 is applied to an amplifier.
Figure 2:
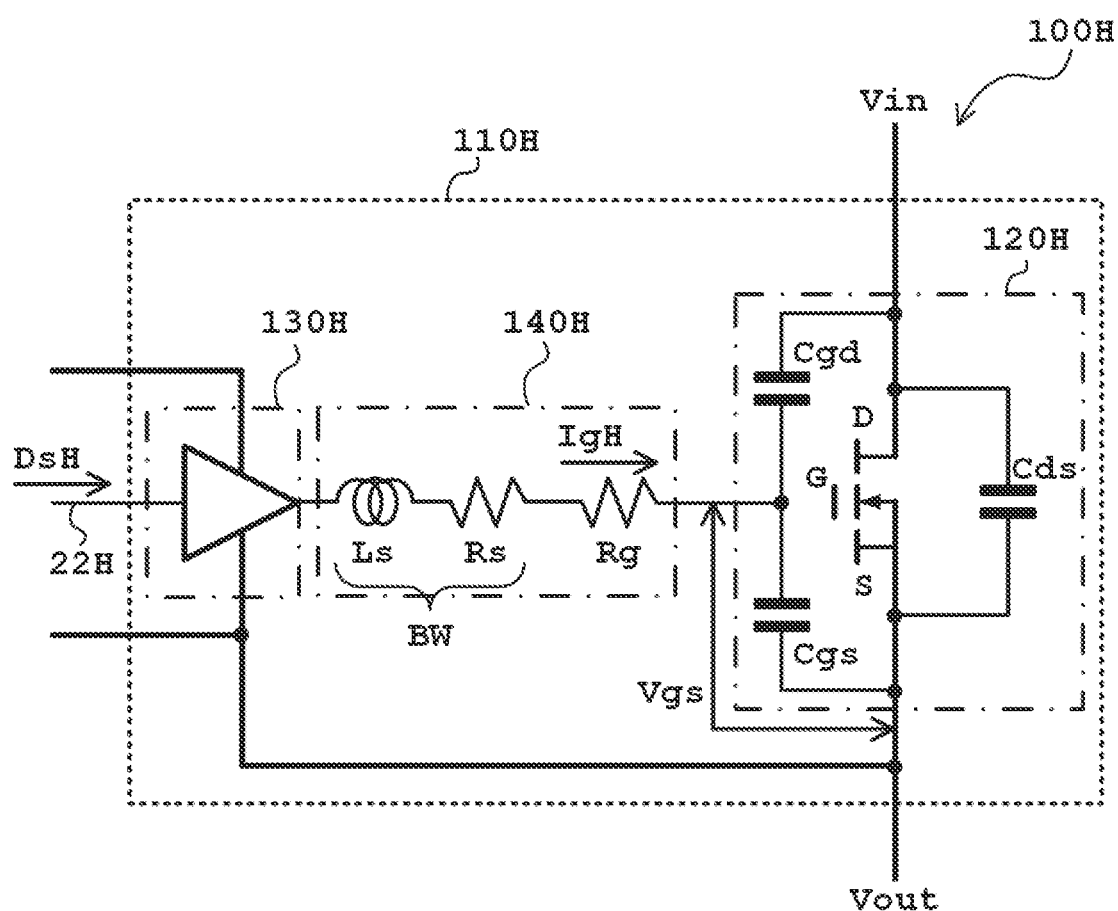
FIG. 2 is a circuit diagram showing an equivalent connection circuit arranged in the vicinity of the switching module shown in FIG. 1.
Figure 3:
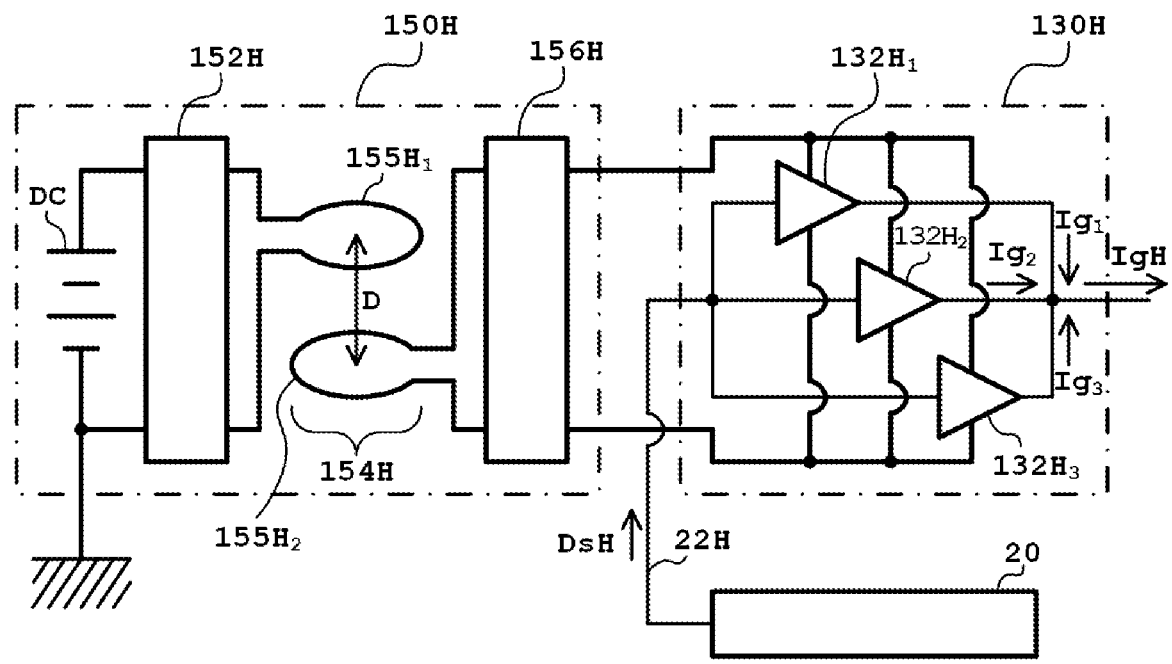
FIG. 3 is a block diagram showing overviews of a driver power supply and a driver circuit shown in FIG. 1.

FIG. 1 is a block diagram of a high-frequency power supply device, in which a switching module according to Embodiment 1, which is a representative example of the invention, is applied as an amplifier. In addition to that, FIG. 2 is a circuit diagram showing an equivalent connection circuit in the vicinity of the switching module shown in FIG. 1. Furthermore, FIG. 3 is a block diagram showing overviews of a driver power supply and a driver circuit shown in FIG. 1. Such a high-frequency power supply device is applied to be used in semiconductor manufacturing equipment whose amplifier has output of 1 kW or more and output frequency of 0.3 MHz or more, by way of example.

As shown in FIG. 1, a high-frequency power supply device 1 adopting a switching module according to Embodiment 1 includes, for instance, a direct current (DC) power supply 10 that supplies a DC voltage to be switched, a switching module 100H that is connected to an input end on one side (high-side) of the DC power supply 10, a switching module 100L that is connected to an input end of the other side (low-side) of the DC power supply 10, and a control unit 20 that outputs drive signals to the switching modules 100H, 100L.

FIG. 1 illustrates a high-frequency power supply device consisting of so-called half-bridge circuit that includes a pair of switching modules. Alternatively, a high-frequency power supply device consisting of a full-bridge circuit including two pairs of switching modules may be employed. In here, since the switching modules 100H and 100L have the same configuration, a detailed description will be made about embodiments with a high-side switching module only, and a description about embodiments with a low-side switching module will be omitted.

The switching module 100H according to Embodiment 1 includes a GaN-FET 120H mounted on a substrate 110H, a driver circuit 130H connected to a gate electrode G of the GaN-FET 120H via a connection wiring 140H, and a driver power supply 150H that supplies a drive voltage to the driver circuit 130H. As shown in FIG. 1, the control unit 20 is electrically connected to the driver circuit 130H on the high side and the driver circuit 130L on the low side through signal lines 22H, 22L, so as to output drive signals DsH and DsL to the driver circuit 130H and 130L, respectively.

The substrate 110H is made of a material having good thermal conductivity, such as beryllium oxide (BeO) or aluminum nitride (AlN), by way of example. This enables effective dissipation or discharge of heat produced when a module is driven.

The GaN-FET 120H is a type of field-effect transistor (FET) device having a current flow path formed of gallium nitride (GaN), and is configured as a power semiconductor having a "horizontal" structure in which a gate electrode G, a source electrode S and a drain electrode D are placed in the same plane. This configuration allows the GaN-FET 120H to perform a switching operation faster than a common MOSFET.

The driver circuit 130H has a configuration shown in FIG. 3 as an example in which logic integrated circuits (IC) consisting of multiple transistor-transistor logic (TTL) elements $132H_1$, $132H_2$, $132H_3$ are connected in parallel. Although FIG. 3 illustrates the case of having three TTL elements $132H_1$ to $132H_3$, the present invention can use any number of logic ICs as long as multiple ICs are connected in parallel.

The connection wiring 140H has a configuration, as an example, that includes a bonding wire BW made of such as gold, copper or aluminum and a gate resistance Rg. This connection wiring 140H is simulated as an electrical equivalent connection circuit, as shown in FIG. 2, that includes the gate resistance Rg, a floating inductance Ls and a resistance component Rs. In this case, a resistance value of the gate resistance Rg is selected based on a parasitic capacitance of the GaN-FET 120H to thereby control a damping rate of a gate-to-source voltage Vgs applied from the gate electrode G.

The driver power supply 150H includes, for instance, an inverter 152H that converts an input from a direct current power supply DC into an alternate current, a transformer 154H that transforms the alternate current from the inverter 152H, and a converter 156H that reconverts the alternate current input from the transformer 154H into a direct current. A current output from the converter 156H is input in parallel to each of the TTL elements $132H_1$ to $132H_3$ of the driver circuit 130H.

The switching module 100H according to the invention uses the GaN-FET 120H as a switching element, so that a gate current IgH input from the driver circuit 130H to the gate electrode G can be reduced comparing to a common MOS-FET, for instance. As an example, a MOS-FET using a conventional-type silicon substrate has a large input capacity Ciss (about 600 to 3000 pF) and a large gate voltage Vgs (e.g., 12 V or more) required to use an element in a saturation region in a high-frequency band (e.g., 13.56 MHz). Thus, it is necessary to increase power supply of the driver power supply for driving the driver circuit (e.g., 10 W or more).

By contrast, the GaN-FET 120H employed in Embodiment 1 has smaller input capacity than the common MOS-FET (about 150 to 300 pF) and a gate voltage Vgs of 5 V or less required to use the element in the saturation region, so that the supply voltage of the driver power supply 150H can be about 1 to 2 W. Furthermore, since the GaN-FET can drive at a speed faster than that of the MOS-FET using the conventional silicon substrate, a displacement voltage gradient (dV/dt) of a drain-to-source voltage Vds increases (e.g., 100 V/ns). As a consequence, a malfunction may occur in the high-side switching during high-speed driving, and thus a smaller coupling capacitance of the driver power supply for supplying the gate voltage should be as small as possible (e.g., 5 pF or less).

In Embodiment 1, the transformer 154H of the driver power supply 150H is formed as a coreless transformer having a pair of air-core coils $155H_1$, $155H_2$, as shown in FIG. 3. Thus, the size of the transformer 154H can be decreased to reduce the supply power as well as reducing the coupling capacitance of the power supply. As a consequence, the footprint (area) of the entire transformer power supply can be reduced.

Next, a description will be made about the switching operation of the GaN-FET in the switching module 100H according to Embodiment 1 shown in FIGS. 1 to 3.

For example, in the high-frequency power supply device 1 shown in FIG. 1, either one of the switching modules 100H and 100L is turned on to output an input from the DC power supply 10 as a high-frequency voltage VF. Then, the control unit 20 sends a drive signal DsH or DsL to the corresponding module over the signal line 22H or 22L, the drive signal being for ON-driving the switching module 100H or 100L.

As shown in FIG. 2, the driver circuit 130H outputs the gate current IgH over the connection wiring 140H while receiving the drive signal DsH. The GaN-FET 120H that receives the gate current IgH in the gate electrode G goes into an ON state, and outputs the power input from an input terminal Vin to an output terminal Vout. These steps are repeated to perform the switching operation on the high-side and low-side switching modules 100H, 100L.

As shown in FIG. 3, in the driver circuit 130H according to the first embodiment, the TTL elements $132H_1$ to $132H_3$ to which the voltage from the driver power supply 150H is connected are provided in parallel to form a logic IC. At this time, the drive signal DsH from the control unit 20 is input to the parallel-connected TTL elements $132H_1$ to $132H_3$, and these elements output gate currents $Ig_1$ to $Ig_3$, respectively. These gate currents $Ig_1$ to $Ig_3$ merges with one another at the subsequent stage to become the gate current IgH.

Thus, even if the output levels of the gate currents $Ig_1$ to $Ig_3$ from the respective TTL elements $132H_1$ to $132H_3$ are low, the gate current IgH output from the driver circuit 130H as a composite current of multiple gate currents can be at a desired level. As a logic circuit constituting a logic IC, an arbitrary type of circuit can be adopted, such as AND circuit, OR circuit or buffer circuit.

A specific configuration of the switching module 100H according to Embodiment 1 may be one presented below.

For example, in a case where a switching frequency is 13.56 MHz, the gate drive power needed to perform the switching operation on the GaN-FET 120H illustrated in Embodiment 1 is approximately 0.1 W. For obtaining such gate drive power, it is sufficient to connect two or three TTL elements $132H_1$ to $132H_3$ shown in FIG. 3 in parallel.

On the other hand, as described above, the gate drive power of the GaN-FET 120H may be a few W at most, so that in an isolating transformer to be used in the driver power supply 150H for supplying drive power to the driver circuit 130H, for instance, the air-core coils $155H_1$, $155H_2$ can also be reduced to a size of 20 mm in coil diameter and 1 mm in spacing between the coils by using a material with dielectric constant ε=1. Consequently, capacitance CtH between the windings of the air-core coils $155H_1$, $155H_2$ can be suppressed to 5 pF or less.

The coil diameter can be further decreased by using a material with the dielectric constant ε of more than 1 for the air-core coils $155H_1$, $155H_2$. Furthermore, FIG. 3 illustrates the air-core coils $155H_1$, $155H_2$ with a circular shape, but the coils may have a polygonal shape, and their turns ratios can be selected arbitrarily.

With the above-described configuration, the switching modules 100H and 100L according to Example 1 can implement high-speed switching using GaN-FETs even with a simple and low-cost configuration by configuring the driver circuits 130H and 130L for inputting gate currents IgH and IgL to the gate electrodes G of the GaN-FETs 120H and 120L with logic ICs each having a plurality of TTL elements $132H_1$ to $132H_3$ connected in parallel.

Embodiment 2

Figure 4:
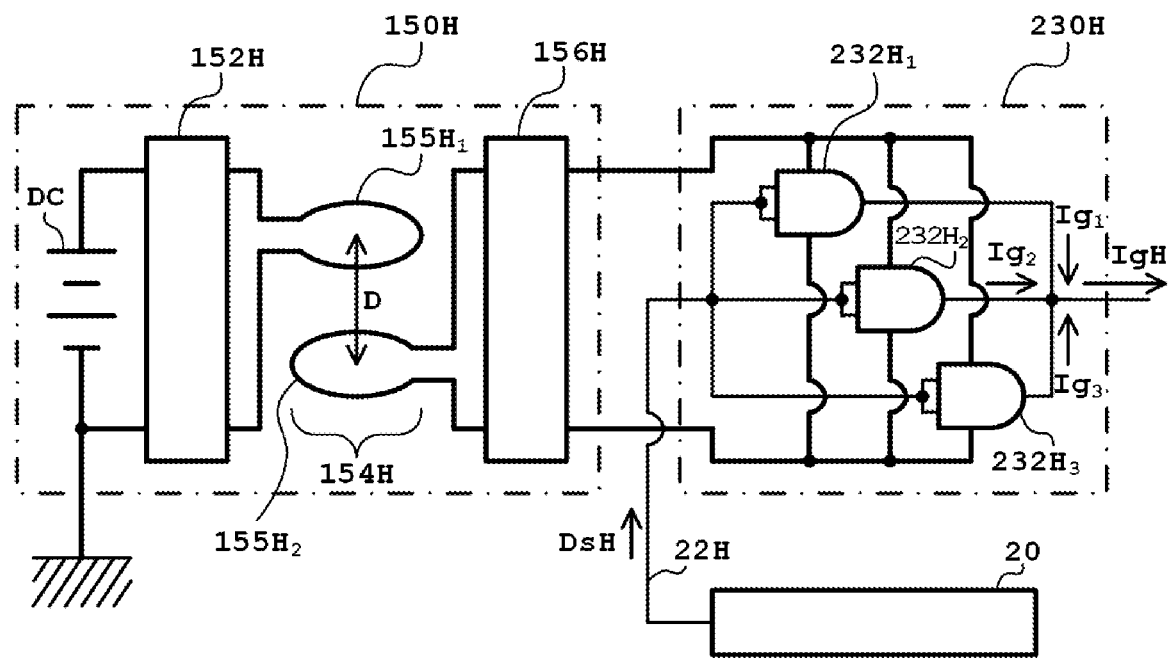
FIG. 4 is a block diagram showing overviews of a driver power supply and a driver circuit of a switching module according to Embodiment 2.

FIG. 4 is a block diagram showing overviews of a driver power supply and a driver circuit of a switching module according to Embodiment 2. In here, components in the switching module of Embodiment 2 that have the same or similar configurations as those in the module of Embodiment 1 will be denoted by the same reference numerals as those in Embodiment 1, and thus the details about them will be omitted.

In a switching module 100H according to Embodiment 2, a driver circuit 230H has a configuration in which a logic IC including a plurality of CMOS elements $232H_1$, $232H_2$ and $232H_3$ connected in parallel, as shown in FIG. 4 as an example. As with the case of Embodiment 1, FIG. 4 illustrates a case of using three CMOS elements $232H_1$ to $232H_3$. Alternatively, any number of logic ICs can be employed as long as multiple logic ICs are connected in parallel.

In the driver circuit 230H according to Embodiment 2, the CMOS elements $232H_1$ to $232H_3$, to which a voltage from the driver power supply 150H is connected, are connected in parallel to form the logic IC. In this case, a drive signal DsH from the control unit 20 is input to the parallel-connected CMOS elements $232H_1$ to $232H_3$, and these elements output gate currents $Ig_1$ to $Ig_3$, respectively. These gate currents $Ig_1$ to $Ig_3$ merge with one another at the subsequent stage to become the gate current IgH.

Thus, as with the case shown in FIG. 3, even if the output levels of the gate currents $Ig_1$ to $Ig_3$ from the respective CMOS element $232H_1$ to $232H_3$ are low, the gate current IgH output from the driver circuit 230H as a composite current of multiple gate currents can be at a desired level. In this case, the power consumption in a common CMOS element for obtaining an output in comparable level is smaller than that in a TTL element, so that the use of the driver circuit 230H according to this variation can reduce the capability of the driver power supply 150H.

With this configuration, the switching modules 100H, 100L according to Embodiment 2 can produce the effect obtained by the switching modules in Embodiment 1, and furthermore the configuration having the logic ICs consisting of the COMS elements can further simplify the structure of the driver power supply, thereby enabling the decrease in entire size of each switching module.

Embodiment 3

Figure 5:
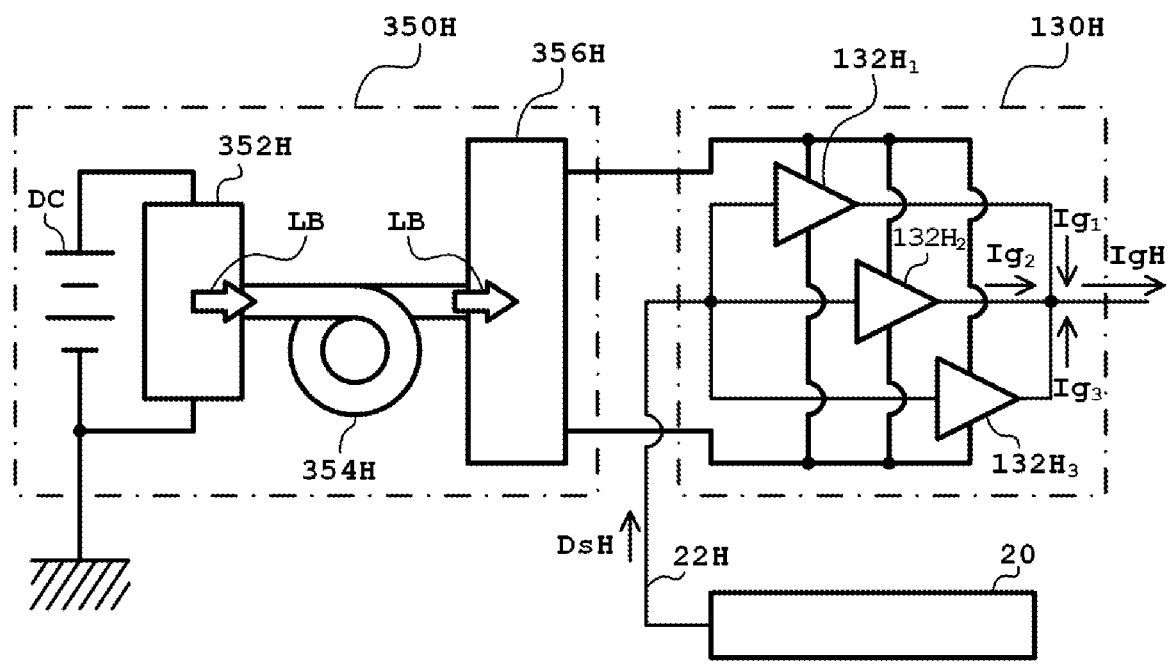
FIG. 5 is a block diagram showing overviews of a driver power supply and a driver circuit of a switching module according to Embodiment 3.

FIG. 5 is a block diagram showing overviews of a driver power supply and a driver circuit of a switching module according to Embodiment 3. As with the case of Embodiment 2, components in the switching module of Embodiment 3 that have the same or similar configurations as those in the module of Embodiment 1 will be denoted by the same reference numerals as those in Embodiment 1, and thus the details about them will be omitted.

As described in Embodiment 1, since a malfunction may occur in the high-side switching when driving the GaN-FET at high speed, it is desired that the coupling capacitance of the driver power supply which supplies a gate voltage is low as much as possible (e.g., 5 pF or less). Thus, Embodiment 3 employs an optical power feeding device as a driver power supply, which is formed by combining a light emitter and a photoelectric transducer.

That is to say, as shown in FIG. 5, in the switching module 100H according to Embodiment 3, a driver power supply 350H includes, as an example, a light emitter 352H that emits light in response to an input from a DC power supply DC, a transmission mechanism 354H that transmits the light emitted from the light emitter 352H, and a photoelectric transducer 356H that transduces the transmitted light into electric power. The electric power output by the photoelectric transducer 356H is input to the TTL elements $132H_1$ to $132H_3$, which are multi-connected in parallel as a logic IC of the driver circuit 130H.

The light emitter 352H is formed by a device that emits light when a semiconductor laser (LD) or light-emitting diode (LED) is energized, by way of example. It enables the reduction in size of the driver power supply 350H even further as well as power savings in the DC power supply DC. The light emitter 352H may employ light emitting means, such as lamp, depending on the configuration of the photoelectric transducer 356H, about which will be described later.

As the transmission mechanism 354H, an optical system such as a mirror arranged on the optical path or a transmission path such as an optical fiber can be applied, for example, when the light to be transmitted is highly directional light such as the above-described laser light. In particular, in a case where the transmission mechanism 354H consists of an optical fiber, the length of the fiber can be adjusted to construct an isolated power supply with the capacitance CtH between the light emitter 352H and the photoelectric transducer 356H being 1 pF or lower. Furthermore, a method for transmitting light through the optical fiber can be adopted to form the light emitter 352H separate from the switching module 100H, thereby enabling further simplification of the overall configuration of the module.

The photoelectric transducer 356H is configured as a semiconductor device such as photodiode or phototransistor, or a device that can transduce the input light energy into electric power such as photocell, for instance. In this case, the light emitter 352H may be arranged close to the photoelectric transducer 356H so that the power can be transmitted via the space between them without providing the transmission mechanism 354H.

With this configuration, the switching modules 100H, 100L according to Embodiment 3 can produce the effect obtained by the switching modules in Embodiment 2, and furthermore since the drive power of the driver power supply itself can be reduced by forming the driver power supplies 150H, 150L as optical power feeding devices, the size of the entire switching module can be further reduced. Moreover, the power supply capacity (capacitance) between the light emitter 352H and the photoelectric transducer 356H can be minimized by adjusting the distance between them, thereby preventing the malfunction of the GaN-FET 120H.

The above description about each embodiment is an example of the switching module according to the present invention, and the invention is not limited to these embodiments. Furthermore, one skilled in the art can make modifications in various ways based on the purport of the invention, which will not be excluded from the scope of the invention.

REFERENCE SIGNS LIST

1 High-Frequency Power Supply Device
10 DC Power Supply
20 Control Unit
22H, 22L Signal Line
100H, 100L Switching Module
110H, 110L Substrate
120H, 120H GaN-FET
130H, 130L, 230H Driver Circuit
$132H_1$, $132H_2$, $132H_3$ TTL Element
140H, 140L Connection Wiring
150H, 150L, 350H Driver Power Supply
$232H_1$, $232H_2$, $232H_3$ CMOS Element
352H Light Emitter
354H Transmission Mechanism
356H Photoelectric Transducer
G Gate Electrode
D Drain Electrode
S Source Electrode
IgH, IgL Gate Current
Vgs Gate-to-Source Voltage
DsH, DsL Drive Signal

The invention claimed is:

1. A switching module comprising a GaN-FET mounted on a substrate, a driver circuit connected to a gate electrode of the GaN-FET via a gate resistance, and a driver power supply for applying a drive voltage to the driver circuit, wherein
the driver circuit has a configuration in which a plurality of logic integrated circuits (ICs) are connected in parallel with a same drive signal input, and output currents from the plurality of logic integrated circuits (ICs) simultaneously drive the GaN-FET as a single gate current; and
the driver power supply includes a coreless transformer having an air-core coil.

2. The switching module according to claim 1, wherein the logic IC consists of TTL elements or CMOS elements.

3. A switching module comprising a GaN-FET mounted on a substrate, a driver circuit connected to a gate electrode of the GaN-FET via a gate resistance, and a driver power supply for applying a drive voltage to the driver circuit, wherein
the driver circuit has a configuration in which a plurality of logic integrated circuits (ICs) are connected in parallel with a same drive signal input, and output currents from the plurality of logic integrated circuits (ICs) simultaneously drive the GaN-FET as a single gate current; and
the driver power supply comprises a light emitter and a photoelectric transducer for transducing light emitted from the light emitter.

4. The switching module according to claim 3, wherein the light emitter and the photoelectric transducer are connected to each other by an optical fiber.

5. The switching module according to claim 3, wherein the logic IC consists of TTL elements or CMOS elements.

* * * * *